United States Patent
Osugi et al.

[11] Patent Number: 6,066,266
[45] Date of Patent: May 23, 2000

[54] IN-SITU CHEMICAL-MECHANICAL POLISHING SLURRY FORMULATION FOR COMPENSATION OF POLISH PAD DEGRADATION

[75] Inventors: Richard S. Osugi, Milpitas; Ronald J. Nagahara, San Jose; Dawn M. Lee, Morgan Hill, all of Calif.

[73] Assignee: LSI Logic Corporation, Mipitas, Calif.

[21] Appl. No.: 09/112,403

[22] Filed: Jul. 8, 1998

[51] Int. Cl.$^7$ ..................................................... B44C 1/22
[52] U.S. Cl. ................ 216/85; 216/53; 216/91; 216/93; 438/692; 438/693
[58] Field of Search .................. 216/38, 52, 53, 216/85, 89, 91, 93, 95; 438/692, 693; 451/36, 6

[56] References Cited

U.S. PATENT DOCUMENTS

| | | |
|---|---|---|
| 4,793,895 | 12/1988 | Kaanta et al. . |
| 5,036,015 | 7/1991 | Sandhu et al. . |
| 5,081,421 | 1/1992 | Miller et al. . |
| 5,151,584 | 9/1992 | Ebbing et al. . |
| 5,169,491 | 12/1992 | Doan . |
| 5,196,353 | 3/1993 | Sandhu et al. . |
| 5,222,329 | 6/1993 | Yu . |
| 5,240,552 | 8/1993 | Yu et al. . |
| 5,245,790 | 9/1993 | Jerbic . |
| 5,245,794 | 9/1993 | Salugsugan . |
| 5,265,378 | 11/1993 | Rostoker . |
| 5,272,115 | 12/1993 | Sato . |
| 5,308,438 | 5/1994 | Cote et al. . |
| 5,310,455 | 5/1994 | Pasch et al. . |
| 5,321,304 | 6/1994 | Rostoker . |
| 5,337,015 | 8/1994 | Lustig et al. . |
| 5,389,194 | 2/1995 | Rostoker et al. . |
| 5,399,234 | 3/1995 | Yu et al. . |
| 5,403,228 | 4/1995 | Pasch . |
| 5,405,806 | 4/1995 | Pfeister et al. . |
| 5,439,551 | 8/1995 | Meikle et al. . |
| 5,483,568 | 1/1996 | Yano et al. . |
| 5,492,594 | 2/1996 | Burke et al. . |
| 5,516,400 | 5/1996 | Pasch et al. . |
| 5,531,861 | 7/1996 | Yu et al. . |
| 5,559,428 | 9/1996 | Li et al. . |
| 5,561,541 | 10/1996 | Sharp et al. . |
| 5,595,526 | 1/1997 | Yau et al. . |
| 5,597,442 | 1/1997 | Chen et al. . |

(List continued on next page.)

FOREIGN PATENT DOCUMENTS 0 849 778  6/1998  European Pat. Off. ...... H01L 21/306

*Primary Examiner*—Randy Gulakowski
*Assistant Examiner*—Allan Olsen
*Attorney, Agent, or Firm*—Beyer & Weaver, LLP

[57] ABSTRACT

A process for compensating for degradation of a first polishing pad during polishing on the first polishing pad of a plurality of substrate surfaces that have substantially similar film stacks is described. The process includes: (a) characterizing a test polishing pad, which characterization includes determining changes in film removal rates of layers of the film stack during polishing of the plurality of the substrate surfaces on the test polishing pad; (b) polishing a first substrate surface on the first polishing pad, which is substantially similar to the test polishing pad, under a first set of polishing conditions; and (c) polishing a second substrate surface on the first polishing pad under a second set of polishing conditions. A difference between the second set of polishing conditions and the first set of polishing conditions is designed to minimize the changes in the film removal rates of the layers of the film stack and thereby compensate for degradation of the first polishing pad.

31 Claims, 2 Drawing Sheets

U.S. PATENT DOCUMENTS

| | | |
|---|---|---|
| 5,609,511 | 3/1997 | Moriyama et al. . |
| 5,624,304 | 4/1997 | Pasch et al. . |
| 5,626,715 | 5/1997 | Rostoker . |
| 5,637,185 | 6/1997 | Murarka et al. . |
| 5,639,388 | 6/1997 | Kimura et al. . |
| 5,643,046 | 7/1997 | Katakabe et al. . |
| 5,643,050 | 7/1997 | Chen . |
| 5,644,221 | 7/1997 | Li et al. . |
| 5,647,952 | 7/1997 | Chen . |
| 5,658,183 | 8/1997 | Sandhu et al. . |
| 5,660,672 | 8/1997 | Li et al. . |
| 5,663,797 | 9/1997 | Sandhu . |
| 5,664,987 | 9/1997 | Renteln . |
| 5,667,424 | 9/1997 | Pan . |
| 5,667,433 | 9/1997 | Mallon . |
| 5,667,629 | 9/1997 | Pan et al. . |
| 5,668,063 | 9/1997 | Fry et al. . |
| 5,670,410 | 9/1997 | Pan . |
| 5,672,091 | 9/1997 | Takahashi et al. . |
| 5,674,784 | 10/1997 | Jang et al. . |
| 5,695,660 | 12/1997 | Litvak . |
| 5,700,180 | 12/1997 | Sandhu et al. . |
| 5,705,435 | 1/1998 | Chen . |
| 5,710,076 | 1/1998 | Dai et al. . |
| 5,712,185 | 1/1998 | Tsai et al. . |
| 5,722,875 | 3/1998 | Iwashita et al. . |
| 5,741,171 | 4/1998 | Sarfaty et al. . |
| 5,777,739 | 7/1998 | Sandhu et al. . |
| 5,861,055 | 1/1999 | Allman et al. . |
| 5,865,666 | 2/1999 | Nagahara . |
| 5,868,608 | 2/1999 | Allman et al. . |
| 5,872,633 | 2/1999 | Holzapfel et al. ............... 356/381 |
| 5,882,251 | 3/1999 | Berman et al. . |
| 5,888,120 | 3/1999 | Doran . |
| 5,893,756 | 4/1999 | Berman et al. . |
| 5,893,796 | 4/1999 | Birang et al. ............... 451/526 |
| 5,931,719 | 8/1999 | Nagahara et al. . |
| 5,948,697 | 9/1999 | Hata . |
| 5,957,757 | 9/1999 | Berman . |

6,066,266

IN-SITU CHEMICAL-MECHANICAL POLISHING SLURRY FORMULATION FOR COMPENSATION OF POLISH PAD DEGRADATION

BACKGROUND OF THE INVENTION

The present invention relates to compensating for degradation of polishing pads employed for chemical-mechanical polishing (CMP) of integrated circuit (IC) substrates. The present invention more particularly relates to compensating for degradation of polishing pads by changing a slurry composition and/or rotational speed of the polishing pad during chemical-mechanical polishing (CMP) of a plurality of substrate lots.

CMP typically involves mounting an IC substrate face down on a holder, and rotating the substrate against a polishing pad mounted on a platen, which in turn is rotating or is in orbital state. A slurry containing a chemical that chemically interacts with the facing substrate layer and an abrasive that physically removes that layer is flowed between the substrate and the polishing pad or on the polishing pad near the substrate. This technique is commonly employed to planarize IC substrate layers, e.g., dielectric and metallization layers.

A typical CMP operation in an IC fabrication facility includes polishing IC substrate surfaces of a plurality of substrate lot. The term "substrate lot," as used in connection with the description of this invention, refers to a collection of about 25 substrates that are typically processed in a group under substantially similar conditions.

Unfortunately, the polishing pad suffers from wear during polishing of the plurality of substrate lots and degrades in performance. Consequently, it is difficult to fabricate IC features, e.g., alignment marks, with reproducible dimensions from substrate lot to substrate lot when the IC substrate surfaces are polished for a fixed period of time on the same polishing pad. The degradation of the polishing pad produces lower film removal rates for some layers and a higher film removal rate for other layers that are being polished on the same IC substrate surface. By way of example, FIG. 1 shows a graph of film removal rate versus the polishing pad life when various layers required to fabricate a metal plug are undergoing polishing. A metal plug formed in a dielectric layer, e.g., layer of silicon dioxide, includes an adhesion layer, e.g., layer of titanium, a barrier layer, e.g., layer of titanium nitride, and a bulk metal layer, e.g., a tungsten layer, that is substantial portion of the metal plug composition. As more and more substrate surfaces are polished on the same polishing pad, the polishing pad ages or degrades. Typically the life of a polishing pad may be long enough to polish between about 100 and about 300 substrates.

As shown in FIG. 1, a film removal rate 12 of a tungsten layer increases with an aging pad and film removal rates 14, 16 and 18 of titanium nitride, silicon dioxide and titanium layers, respectively, decrease with an aging pad. Those skilled in the art will recognize that the film removal rate of silicon dioxide may increase or decrease depending on the polishing conditions, e.g., slurry composition or type or hardness of the polishing pad. Furthermore, it is important to note that the change in film removal rates 12, 14, 16 and 18 are not proportional to each other. As a result, the selectivity of the film removal rates of the various layers mentioned above with respect to each other also change with an aging pad. The term "selectivity," as used in connection with the description of this invention refers to a ratio of a film removal rate of a first layer with respect to a film removal rate of a second layer, which is typically below the first layer. Those skilled in the art will recognize that the film removal rates of various IC substrate layers undergoing polishing on the same polishing pad drastically change from one substrate lot to another and sometimes drastically change within a substrate lot. By way of example, the film removal rates observed during polishing various layers on a substrate surface of a substrate lot may be significantly different from the film removal rates observed when polishing another substrate that belongs to another substrate lot or the film removal rates of the first substrate are significantly different from the film removal rates of the fifteenth substrate within the same substrate lot.

What is therefore needed is a process for compensating for polishing pad degradation due to the aging of the polishing pad to stabilize film removal rates on an IC substrate surface.

SUMMARY OF THE INVENTION

To achieve the foregoing, in one aspect, the present invention provides a process for compensating for degradation of a first polishing pad during polishing on the first polishing pad of a plurality of substrate surfaces that have substantially similar film stacks. The process includes: (a) characterizing a test polishing pad, which characterization includes determining changes in film removal rates of layers of the film stack during polishing of the plurality of the substrate surfaces on the test polishing pad; (b) polishing a first substrate surface on the first polishing pad, which is substantially similar to the test polishing pad, under a first set of polishing conditions; and (c) polishing a second substrate surface on the first polishing pad under a second set of polishing conditions. A difference between the second set of polishing conditions and the first set of polishing conditions is designed to minimize the changes in the film removal rates of the layers of the film stack and thereby compensate for degradation of the first polishing pad.

The plurality of substrate surfaces may be surfaces of a plurality of substrate lots and the first substrate surface may be a surface of a substrate that belongs to a first substrate lot and the second substrate surface may be a surface of a substrate that belongs to a second substrate lot. The first and second substrate lots may be different from each other. The film stack may include at least one layer selected from the group consisting of a layer of tungsten, a layer of titanium nitride, a layer titanium and a layer of silicon dioxide. The step of characterizing the test polishing pad may include measuring a thickness of each of the layers of the film stack using a laser beam after polishing the film stack for a certain period of time on the test polishing pad.

The first set of polishing conditions may include a first slurry composition and the second polishing conditions may include a second slurry composition. The step of polishing the first and the second substrate surfaces may include polishing a metal layer of the film stack and the second slurry composition may include a metal etchant of a lower concentration than the first slurry composition. By way of example, the steps of polishing the first and the second substrate surfaces include polishing a tungsten layer and the first slurry composition includes between about 2% and about 15% solution of hydrogen peroxide by volume and the second slurry composition includes between about 0.5% and about 10% solution of hydrogen peroxide by volume. Preferably the second slurry composition includes about 0.5% solution of hydrogen peroxide by volume.

The metal layer may be a tungsten layer and the metal etchant may be at least one compound selected from the group consisting of ferric nitrate ($Fe(NO_3)_3$), hydrogen peroxide ($H_2O_2$), and potassium iodate ($KIO_3$). If a film removal rate of the tungsten layer is being stabilized, then an average size of an abrasive particle in the second slurry composition may be smaller than the first slurry composition. If a silicon dioxide layer of the film stack is being stabilized, then the second slurry composition may have a higher concentration of abrasive particles than the first slurry composition, the second slurry composition may have a higher pH than the first slurry composition or the average particle size of the abrasive particles may be increased. The second set of polishing conditions may include polishing the second substrate surface at a higher rotational speed than polishing the first substrate surface.

The substrate surface may be a semiconductor wafer. The step of characterization of the test polishing pad may include determining a predefined film removal rate for each of the layers of the film stack and the step of polishing the second substrate surface under the second set of polishing conditions may be performed when the film removal rate of at least one layer of the film stack is greater or less than the predefined film removal rate of that one layer.

In another aspect, the present invention provides a process for stabilizing film removal rates of layers of substantially similar film stacks on a plurality of substrate surfaces. The process includes: (a) polishing a first substrate surface having a first film stack under a first set of polishing conditions to establish a baseline film removal rate for each layer of the first film stack; (b) polishing a second substrate surface having a second film stack and measuring film removal rates for each layer of the second film stack; and (c) changing from the first set of polishing conditions to a second set of polishing conditions when an absolute value of a difference between the film removal rate for one of the layers of the second film stack and the baseline film removal rate of the same layer of the first film stack exceeds a predefined value.

The step of changing may be facilitated by a computer system such that when the computer system determines the difference between the film removal rate and the baseline film removal rate exceeds a predefined threshold, the computer system sends a signal to a chemical-mechanical polishing apparatus to change from a first slurry composition to a second slurry composition. If the difference between the film removal rate of a metal layer of the second film stack and the baseline film removal rate of a metal layer of the first film stack exceeds the predefined value, then the second slurry composition may include a less concentrated solution of a metal etchant than the first slurry composition.

The polishing pad may include at least one materials selected from the group consisting of a urethane, polyurethane, felt, polymer and a filler material. The film stack may include at least one layer selected from the group consisting of a layer of tungsten, a layer of titanium nitride, a layer titanium and a layer of silicon dioxide. The step of measuring film removal rates may be performed during polishing of the second substrate surface by a transparent region in the polishing pad that allows a laser light to be incident upon the substrate surface. The plurality of substrate surfaces may be surfaces of a plurality of substrate lots and the first substrate surface may be a surface of a substrate that belongs to a first substrate lot and the second substrate surface may be a surface of a substrate that belongs to a second substrate lot. The first and second substrate lots are different from each other.

These and other features of the present invention will be described in more detail below in the detailed description of the invention and in conjunction with the following figures.

DETAILED DESCRIPTION OF THE PREFERRED EMBODIMENTS

To achieve the foregoing, the present invention provides a process for compensating for degradation of polishing pad employed during chemical mechanical polishing (CMP). In the following description, numerous specific details are set forth in order to provide a thorough understanding of the present invention. It will be apparent, however, to those skilled in the art, that the present invention may be practiced without some or all of the specific details. By way of example, the present invention is described in terms of chemical-mechanical polishing (CMP) of a film stack used for forming metal plugs in integrated circuits (ICs) and the film stack includes a tungsten layer, a titanium nitride layer and a titanium layer, all of which are disposed above a dielectric layer (e.g., silicon dioxide).

The present invention proposes to compensate for degradation of a polishing pad by changing the polishing conditions employed during chemical-mechanical polishing (CMP) of integrated circuit (IC) substrate lots. By way of example, in order to compensate for degradation of a polishing pad, the slurry composition during chemical-mechanical polishing (CMP) may be changed from one substrate lot to another or from one substrate to another within the same substrate lot. As another example, the rotational speed of the polishing pad may be changed from one substrate lot to another or from one substrate to another within the same substrate lot.

In one embodiment, the inventive process may begin when a test polishing pad is characterized. The test polishing pad is substantially similar to process polishing pads, which are employed during the actual production of ICs (e.g., semiconductor chips). The test and process polishing pads may belong to the same pad lot. The test and process polishing pads include at least one material selected from the group consisting of urethane, polyurethane, felt, polymer and filler material. In this step, preferably the same number of substrate lots that would be polished during a typical CMP cycle may be polished on the test polishing pad to establish a relationship between the change in film removal rates of the various layers of a film stack on the substrate surfaces and the life of the polishing pad. As indicated above, the life of a polishing pad is depleted as more and more substrate surfaces are polished on it.

Before and after polishing all substrate surfaces of each substrate lot for a fixed period of time, the film thickness of the various layers of the film stack on the substrate surface may be measured using a RS 35, UV 1050 or UV 1250, which are commercially available from KLA-Tencor of San Jose, Calif., to arrive at a film removal rate. Typically a laser beam generated by the film thickness measuring tool mentioned above is incident upon the substrate surface during film thickness measurement and the angle of reflectance of the laser beam reflected off the substrate surface is measured to determine the film thickness.

Figure 1:
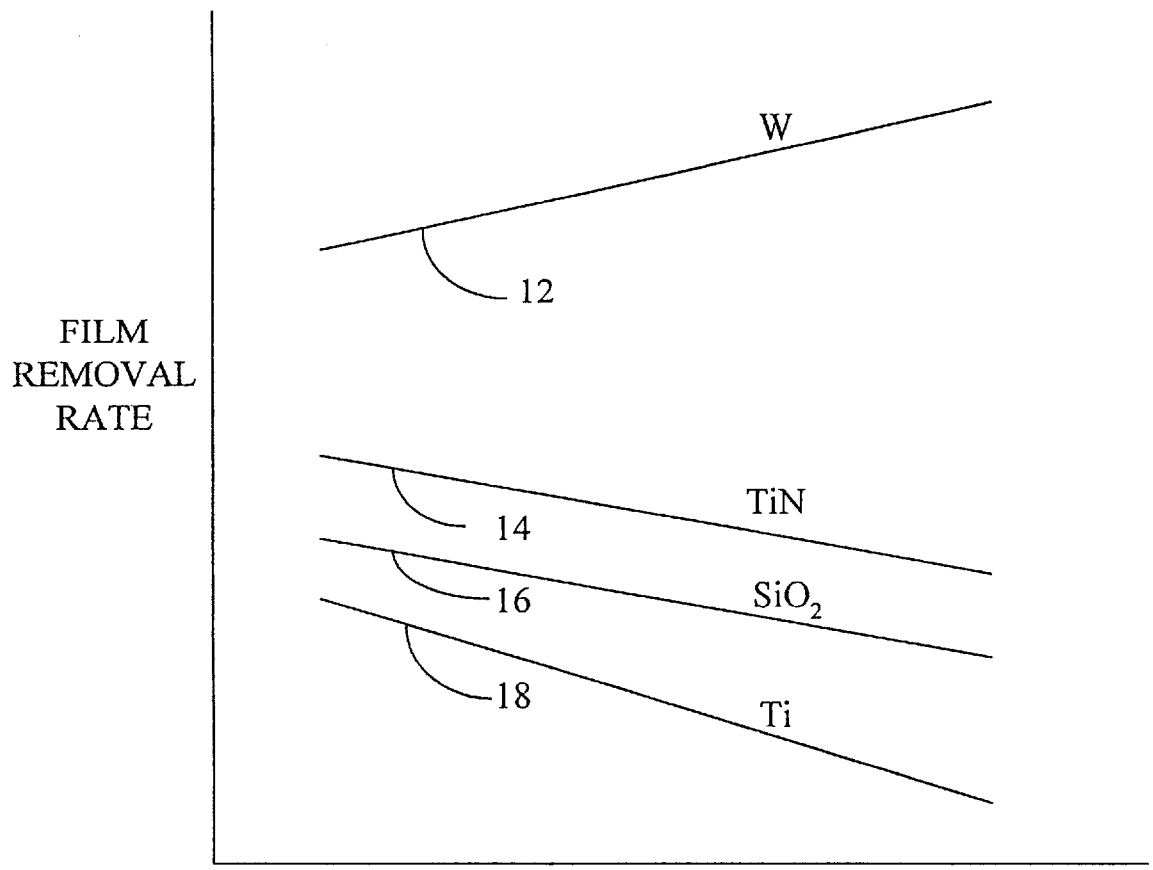
FIG. 1 shows a graphical relationship between film removal rates observed during chemical-mechanical polishing of integrated circuit substrate lots versus polishing pad life.

The film removal rates, calculated as described above, of the various layers of a film stack on a particular substrate is then correlated to the order in which the substrate was polished. In other words, the film removal rates of the various layers for the first substrate polished are correlated to substrate number one, the film removal rates of the same layers for the second substrate are correlated to substrate number two and so on until the film removal rates of all the substrates in the substrate lots are determined. At the end of this step, sufficient data to generate a graph (like the one shown in FIG. 1) of film removal rate versus the polishing pad life may be compiled. It is important to note that if the same number of substrate lots that would be polished during a typical CMP cycle are not polished on the test polishing pad to generate a graph like FIG. 1, then extrapolation techniques well known to those skilled in the art may be employed to estimate the actual film removal rate.

Next, CMP of IC substrate surfaces may commence on a process polishing pad to produce ICs that are ultimately sold. In this step, the polishing conditions are changed from one substrate to another based on the characterization of the test pad in the previous step. By way of example, if it is observed during the characterization of the test polishing pad that the film removal rate of a certain layer of a film stack decreases below a predefined film removal rate or a tolerance level after polishing the fifteenth substrate of the first substrate lot, then the concentration of the component responsible for effective removal of that layer is increased in the slurry formulation during CMP of the sixteenth substrate on the process polishing pad. The polishing conditions may change when polishing IC substrates from one substrate lot to another or when polishing IC substrates within the same substrate lot. Therefore, as a polishing pad proceeds to polish several substrate lots, the polishing conditions, e.g., slurry composition, according to the present invention may change several times during CMP between substrate lots and/or within a substrate lot to stabilize the film removal rate of the various layers of the film stack on the substrate surfaces.

The change or difference in polishing conditions, according to the present invention, are designed to minimize changes in the film removal rate and therefore effectively compensate for degradation of the polishing pad. By way of example, if it is known from the characterization of the polishing pad that the film removal rate of a metal layer, e.g., tungsten, is expected to increase above a predefined film removal rate of the metal layer when polishing a certain substrate, then the concentration of a metal etchant or an oxidizing component, e.g., ferric nitrate ($Fe(NO_3)_3$), hydrogen peroxide ($H_2O_2$), and potassium iodate ($KIO_3$), in the slurry composition is decreased during the CMP of that substrate. Depending on the amount by which the tungsten film removal rate is expected to increase, the slurry composition of between about 2% and about 15% (by volume) hydrogen peroxide solution may be changed to include a lower concentration of hydrogen peroxide, e.g., between about 0.5% and about 10% (by volume) hydrogen peroxide solution. The slurry composition is changed to preferably include about 0.5% (by volume) hydrogen peroxide solution.

As another example, in order to maintain or stabilize the film removal rate of a tungsten layer, the average particle size of the abrasive particles in the slurry composition may be decreased.

As yet another example, if the silicon dioxide film removal rate is expected to drop below a predefined threshold film removal rate for silicon dioxide, the slurry composition may be changed to raise the pH of the slurry, the concentration of the abrasive particles, e.g., alumina, in the slurry may be increased or the average particle size of the abrasive particles may be increased.

As yet another example, if the film removal rate of any of the layers of the film stack is expected to fall below its predefined threshold value, then the rotational speed of the process polishing pad is increased to stabilize the film removal rate and combat the degrading polishing pad performance.

In another embodiment of the inventive process, a polishing pad including a transparent region that allows a laser light to pass through is employed in the CMP apparatus. A laser light incident upon a substrate surface through the transparent polishing pad region, while the substrate surface is being polished, determines the film thickness of various layers of a film stack as mentioned before. By measuring the film thickness of the various layers during CMP, the polishing pad having the transparent region provides film removal rates in-situ as the CMP of the substrate surface is in progress. It should be borne in mind that a test pad need not be employed in this embodiment as it was in the embodiment described above.

In this embodiment, the inventive process may begin when a first substrate surface of the first substrate lot having a film stack is subjected to CMP under an initial set of polishing conditions and a baseline film removal rate for each layer of the film stack is determined using the polishing pad having the transparent region. The baseline film removal rates determined in this step serves as reference points, which are compared to film removal rates of the various layers of film stacks on subsequent substrate surfaces undergoing CMP.

Next, substrate surfaces of the various substrate lots are subjected to CMP on the same polishing pad and the film removal rate of the film stacks on the substrate surfaces are measured as described above. If it is determined, during CMP of a subsequent substrate surface, that an absolute value of a difference between the baseline film removal rate and the film removal rate of any one of the layers of the film stack on the substrate surface (undergoing CMP) is more or less than a predefined value then the polishing conditions are dynamically changed to new polishing conditions. Those skilled in the art will recognize that the predefined value provides a range, within which the changes in film removal rates is tolerable and if the film removal rate decreases or increases beyond this range, then new polishing conditions are employed during CMP. CMP of the subsequent substrates continues under the new polishing conditions until the absolute value of the difference between the baseline film removal rate and the film removal rate of any one of the layers of the film stack on the substrate surface (undergoing CMP) is more or less than a predefined value. As mentioned before, as the polishing pad proceeds to polish several substrate lots, the polishing conditions, e.g., slurry composition and/or rotational speed of the polishing pad, according to the present invention may change several times during CMP between substrate lots and/or within a substrate lot to stabilize the film removal rate of the various layers of the film stack on the substrate surfaces.

In one embodiment of the present invention, the polishing conditions may be changed automatically in response to a change in the film removal rate. The film removal rates may be regularly monitored through the transparent region of the polishing pad and if the absolute value of the difference between the baseline film removal rate and the film removal rate of any one of the layers of the film stack on the substrate surface (undergoing CMP) is more or less than a predefined value, then a signal is sent to the CMP apparatus and the new polishing conditions are automatically activated during CMP to stabilize the film removal rate. By way of example, as mentioned before, if the film removal rate of a metal layer, e.g., tungsten, is to be stabilized during CMP of a certain substrate, then the concentration of a metal etchant or an oxidizing component, e.g., ferric nitrate ($Fe(NO_3)_3$), hydrogen peroxide ($H_2O_2$), and potassium iodate ($KIO_3$), in the slurry composition is decreased or the average particle size of the abrasive particles in the slurry composition may be decreased. The amount of increase in concentration of the slurry components, e.g., oxidizing or abrasive components, may be commensurate with the change in the film removal of a layer from the baseline film removal rate of that layer. As another example, if the silicon dioxide film removal rate is to be stabilized, then the slurry composition may be changed to raise the pH of the slurry the concentration of the abrasive particles, e.g., alumina, in the slurry may be increased or the average particle size of the abrasive particles may be increased. As yet another example, if the film removal rate of any of the layers of the film stack is to be stabilized, then the rotational speed of the polishing pad is increased to stabilize the film removal rate and combat the degrading polishing pad performance.

Suitable computer systems for use in implementing and controlling the automated methods in the present invention, e.g., storing the baseline film removal rates, keep track of polishing time of substrates to calculate film removal rates from the measured film thickness, computing the difference between the baseline film removal rates and film removal rates measured during CMP, activating new polishing conditions, etc. may be obtained from various vendors. In one preferred embodiment, an appropriately programmed HP735 workstation (Hewlett Packard, Palo Alto, Calif.) or Sun ULTRASPARC or Sun SPARC (Sun Microsystems, Sunnyvale, Calif.) may be employed in an IBM PC based system.

It should be understood that the present invention also relates to machine readable media on which are stored instructions for implementing the invention. Such instructions facilitate the comparison of the film removal rates of a substrate during CMP to a baseline film removal rates and activation of new polishing conditions during CMP based on a predetermined criteria. Such media includes, by way of example, magnetic disks, magnetic tape, optically readable media such as CD-ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Figure 2:
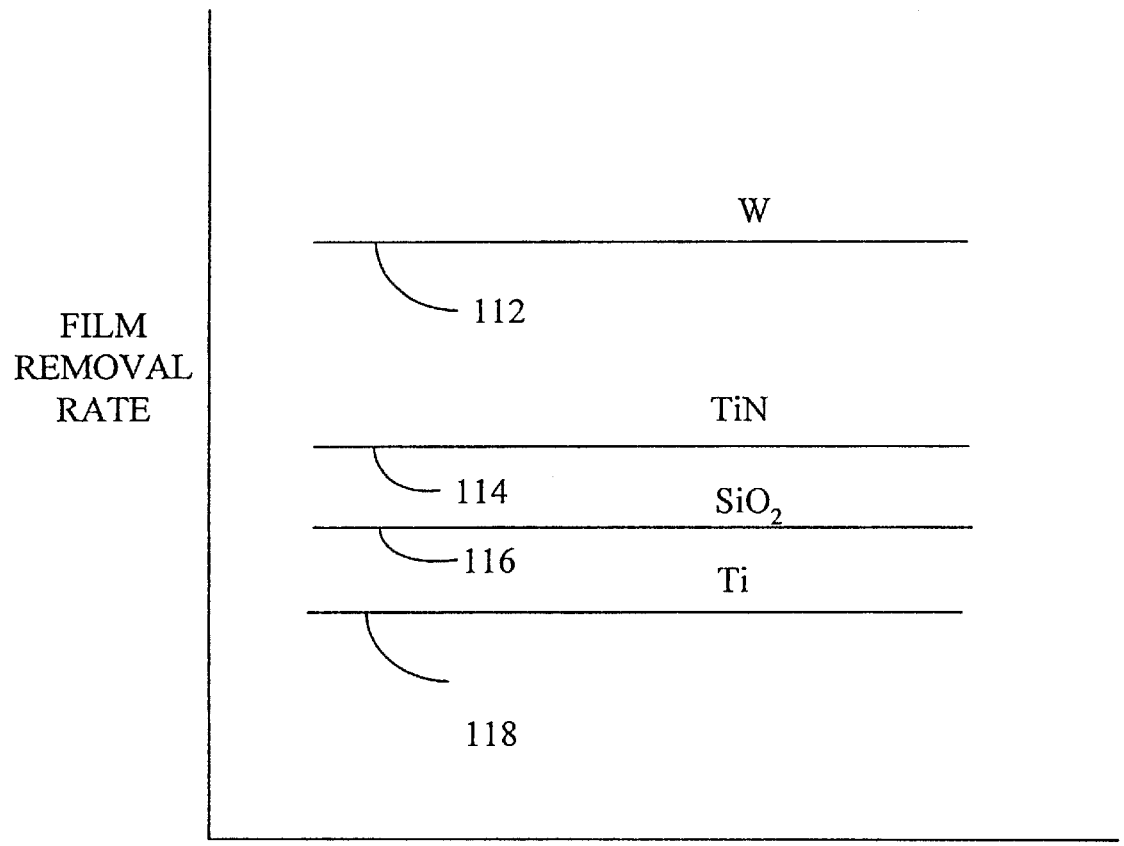
FIG. 2 shows a graphical relationship between film removal rates observed during chemical-mechanical polishing, according to one embodiment of the present invention, of integrated circuit substrate lots versus polishing pad life.

The present invention represents a marked improvement over the current CMP techniques. By way of example, the present invention stabilizes the film removal rates during CMP of substrate lots to produce IC features dimensions that are substantially the same throughout the substrate lot. FIG. 2 shows a graph of film removal rate versus the polishing pad life when various layers required to fabricate a metal plug are undergoing polishing according to the inventive process. As shown in FIG. 2, film removal rate 112, 114, 116 and 118 of a tungsten layer, titanium nitride, silicon dioxide and titanium layers, respectively, are almost constant throughout the life of the polishing pad. As a result, the selectivity of the film removal rates of the various layers mentioned above with respect to each other also remains relatively constant throughout an aging polishing pad.

Although the foregoing invention has been described in some detail for purposes of clarity of understanding, it will be apparent that certain changes and modifications may be practiced within the scope of the appended claims. For example, while the specification has been described in terms stabilizing film removal rates to form conductive plugs, there is in principal no reason why the teachings of the present invention cannot apply to forming other IC features such as alignment marks and the like. Therefore, the present embodiments are to be considered as illustrative and not restrictive, and the invention is not to be limited to the details given herein, but may be modified within the scope of the appended claims.

What is claimed is:

1. A process for compensating for degradation of a first polishing pad during polishing on said first polishing pad of a plurality of substrate surfaces that have substantially similar film stacks, said process comprising:

characterizing a test polishing pad, said characterization includes determining changes in film removal rates of layers of said film stack during polishing of said plurality of substrate surfaces on said test polishing pad;

polishing a first substrate surface on said first polishing pad under a first set of polishing conditions, said first and said test polishing pads are substantially similar; and polishing a second substrate surface on said first polishing pad under a second set of polishing conditions, wherein difference between said second set of polishing conditions and said first set of polishing conditions is designed to minimize said changes in said film removal rates of said layers of said film stack and thereby compensate for degradation of said first polishing pad.

2. The process of claim 1, wherein said plurality of substrate surfaces are surfaces of a plurality of substrate lots and said first substrate surface is a surface of a substrate that belongs to a first substrate lot and said second substrate surface is a surface of a substrate that belongs to a second substrate lot.

3. The process of claim 1, wherein said film stack includes at least one layer selected from the group consisting of a layer of tungsten, a layer of titanium nitride, a layer titanium and a layer of silicon dioxide.

4. The process of claim 1, wherein said characterizing said test polishing pad includes measuring thickness of each of said layers of said film stack using a laser beam after polishing said film stack for a certain period of time on said test polishing pad.

5. The process of claim 1, wherein said first set of polishing conditions include a first slurry composition and said second polishing conditions include a second slurry composition.

6. The process of claim 5, wherein said polishing said first and said second substrate surfaces includes polishing a metal layer of said film stack and said second slurry composition includes a metal etchant of a lower concentration than said first slurry composition.

7. The process of claim 6, wherein said polishing said first and said second substrate surfaces includes polishing a tungsten layer and said first slurry composition includes between about 2% and about 15% solution of hydrogen peroxide by volume and said second slurry composition includes between about 0.5% and about 10% solution of hydrogen peroxide by volume.

8. The process of claim 7, wherein said second slurry composition includes about 0.5% solution of hydrogen peroxide by volume.

9. The process of claim 6, wherein said metal layer is a tungsten layer and said metal etchant is at least one compound selected from the group consisting of ferric nitrate ($Fe(NO_3)_3$), hydrogen peroxide ($H_2O_2$), and potassium iodate ($KIO_3$).

10. The process of claim 6, wherein said metal layer is a tungsten layer and an average size of an abrasive particle in said second slurry composition is smaller than said first slurry composition.

11. The process of claim 5, wherein said polishing said first and said second substrate surfaces includes polishing a silicon dioxide layer of said film stack and said second slurry composition has a higher concentration of abrasive particles than said first slurry composition.

12. The process of claim 5, wherein said polishing said first and said second substrate surfaces includes polishing a silicon dioxide layer of said film stack and said second slurry composition has a higher pH than said first slurry composition.

13. The process of claim 5, wherein said polishing said first and said second substrate surfaces includes polishing a silicon dioxide layer of said film stack and said second slurry composition has a greater average particle size of abrasive particles than said first slurry composition.

14. The process of claim 1, wherein said second set of polishing conditions include polishing said second substrate surface at a higher rotational speed than polishing said first substrate surface.

15. The process of claim 1, wherein said characterization of said test polishing pad includes determining a predefined film removal rate for each of said layers of said film stack and said polishing said second substrate surface under said second set of polishing conditions when said film removal rate of at least one said layer of said film stack is less than said predefined film removal rate of said at least one said layer.

16. A process for stabilizing film removal rates of layers of substantially similar film stacks on a plurality of substrate surfaces, comprising:

polishing a first substrate surface having a first film stack under a first set of polishing conditions to establish a baseline film removal rate for each layer of said first film stack;

polishing a second substrate surface having a second film stack and measuring film removal rates for each layer of said second film stack; and changing from said first set of polishing conditions to a second set of polishing conditions when an absolute value of a difference between said film removal rate for one of said layers of said second film stack and said baseline film removal rate of the same layer of said first film stack exceeds a predefined value.

17. The process of claim 16, wherein said changing is facilitated by a computer system such that when said computer system determines said difference between said film removal rate and said baseline film removal rate exceeds a predefined threshold, said computer system sends a signal to a chemical-mechanical polishing apparatus to change from a first slurry composition to a second slurry composition.

18. The process of claim 17, wherein said difference between said film removal rate of a metal layer of said second film stack and said baseline film removal rate of a metal layer of said first film stack exceeds said predefined value and said second slurry composition includes a less concentrated solution of a metal etchant than said first slurry composition.

19. The process of claim 18, wherein said first slurry composition includes between about 2% and about 15% solution of hydrogen peroxide by volume and said second slurry composition includes between about 0.5% and about 10% solution of hydrogen peroxide by volume.

20. The process of claim 19, wherein said second slurry composition includes about 0.5% solution of hydrogen peroxide by volume.

21. The process of claim 18, wherein said metal layer is a tungsten layer and said metal etchant is at least one compound selected from the group consisting of ferric nitrate ($Fe(NO_3)_3$), hydrogen peroxide ($H_2O_2$), and potassium iodate ($KIO_3$).

22. The process of claim 17, wherein said metal layer is a tungsten layer and an average size of an abrasive particle in said second slurry composition is smaller than said first slurry composition.

23. The process of claim 17, wherein said difference between said film removal rate of a silicon dioxide layer of said second film stack and said baseline film removal rate of a silicon dioxide layer of said first film stack exceeds said predefined value and said second slurry composition has a higher concentration of abrasive particles than said first slurry composition.

24. The process of claim 17, wherein said difference between said film removal rate of a silicon dioxide layer of said second film stack and said baseline film removal rate of a silicon dioxide layer of said first film stack exceeds said predefined threshold and said second slurry composition has a higher pH than said first slurry composition.

25. The process of claim 16, wherein said polishing said first and said second substrate surfaces includes polishing a silicon dioxide layer of said film stack and said second slurry composition has a greater average particle size of abrasive particles than said first slurry composition.

26. The process of claim 16, wherein in said changing, first polishing conditions include a first rotational speed of said first substrate surface and said first rotational speed is less than a second rotational speed of said second polishing conditions.

27. The process of claim 16, wherein said substrate surface is a semiconductor wafer.

28. The process of claim 16, wherein said polishing pad includes at least one material selected from the group consisting of a urethane, polyurethane, felt, polymer and a filler material.

29. The process of claim 16, wherein said film stack includes at least one layer selected from the group consisting of a layer of tungsten, a layer of titanium nitride, a layer titanium and a layer of silicon dioxide.

30. The process of claim 16, wherein said measuring film removal rates are performed during polishing of said second substrate surface by a transparent region in said polishing pad that allows a laser light to be incident upon said substrate surface.

31. The process of claim 16, wherein said plurality of substrate surfaces are surfaces of a plurality of substrate lots and said first substrate surface is a surface of a substrate that belongs to a first substrate lot and said second substrate surface is a surface of a substrate that belongs to a second substrate lot.

* * * * *